United States Patent [19]
Grossi

[11] 3,914,786
[45] Oct. 21, 1975

[54] IN-LINE REFLECTIVE LEAD-PAIR FOR LIGHT-EMITTING DIODES

[75] Inventor: Brian John Grossi, Cupertino, Calif.

[73] Assignee: Hewlett-Packard Company, Palo Alto, Calif.

[22] Filed: Apr. 19, 1974

[21] Appl. No.: 462,285

[52] U.S. Cl. .................... 357/68; 357/17; 357/70; 357/73; 250/552; 313/113

[51] Int. Cl.²...H01L 23/48; H01L 33/00; H01L 22/30; H01L 9/00

[58] Field of Search .................. 357/68, 70, 73, 17; 250/552

[56] References Cited

UNITED STATES PATENTS

| | | | |
|---|---|---|---|
| 3,423,516 | 1/1969 | Segerson | 357/70 |
| 3,727,064 | 4/1973 | Bottini | 357/70 |
| 3,764,862 | 10/1973 | Jankowski | 357/70 |

*Primary Examiner*—Michael J. Lynch
*Assistant Examiner*—E. Wojciechowicz
*Attorney, Agent, or Firm*—F. David LaRiviere; David A. Boone

[57] ABSTRACT

A plurality of flat, subminiature, reflective in-line lead pairs for light-emitting diodes is contained in a frame. Each lead pair has a flat mounting surface for the diode chip. Although the diode chip is mounted on one of the lead pairs, the deep reflector for side-emitted light is formed from both leads of the pair. The reflector configuration provides for mounting semiconductor chips in addition to the diode chip therein. The reflector also precludes an illuminated light-emitting diode from inadvertently illuminating one or more adjacent light-emitting diodes.

7 Claims, 5 Drawing Figures

IN-LINE REFLECTIVE LEAD-PAIR FOR LIGHT-EMITTING DIODES

BACKGROUND OF THE INVENTION

Some light-emitting semiconductor materials used in the fabrication of light-emitting diode (LED) chips radiate light in all directions from the junction thereof. Such materials include gallium phosphide. Reflectors are used to improve the light emission characteristics of LED devices by capturing and reflecting the side-emitted light. Prior art devices, such as that disclosed in U.S. Pat. No. 3,764,862 issued to Alfred S. Jankowski on Oct. 9, 1973, have a recessed, reflective cavity formed in one lead of the two-lead device and in which the semiconductor chip is mounted.

In addition to reflector size constraints owing to lead thickness and cost considerations, the prior art reflective-cavity mountings for LED chips required many and time-consuming assembly steps including careful alignment of the chip to assure parallel emission of light along the lens axis. Furthermore, a very large, costly cavity would be required to house additional semiconductor chips which are included in more sophisticated LED assemblies.

SUMMARY OF THE INVENTION

The preferred embodiment of this invention provides a lead frame for subminiature, highly mechanized low cost light-emitting diode manufacture. The lead frame, formed of an electrically conductive material, comprises a plurality of in-line flat lead pairs on one of which the diode chip is conductively mounted by conventional means. Prior to mounting the chip, the ends of side-extended portions of each lead adjacent the location of the chip when mounted are bent to an angle of approximately 45° with respect to the planar surface of the flat lead-pair along a line perpendicular to the longitudinal axis of the side extensions. The side extensions are then bent along a line parallel to the longitudinal axis thereof to an angle of approximately 45° also with respect to the planar surface of the flat lead-pair to form a reflector around the location on the flat lead at which the chip is to be mounted. After the chip is mounted, a wire is connected between the top thereof and the other lead employing conventional techniques to complete the electrical circuit of the LED assembly. Using conventional transfer molding techniques, the lead pairs are then encapsulated in electrically-insulating transparent material that assures mechanical rigidity. The cured encapsulating material is transfer molded to magnify the light emitted from the diode chip and reflected from the sides of the reflector.

One object of the present invention therefore is to provide a subminiature in-line LED lead pair having a reflector formed from both the anode and the cathode sections thereof.

Another object of the invention is to provide a deep (LED) reflector constructed of a very thin lead frame material while also providing a flat mounting surface for the LED chip.

Still another object of the invention is to provide a subminiature LED package in which semiconductor chips in addition to the LED chip may be mounted.

A further object of the invention is to provide a subminiature LED package in which the light reflector prevents illuminating adjacent devices in a high-density array thereof.

A still further object of the present invention is to provide a high quality LED in which nearly all light emission is coaxial with the optical axis of the lens.

DESCRIPTION OF THE PREFERRED EMBODIMENT

Figure 1:
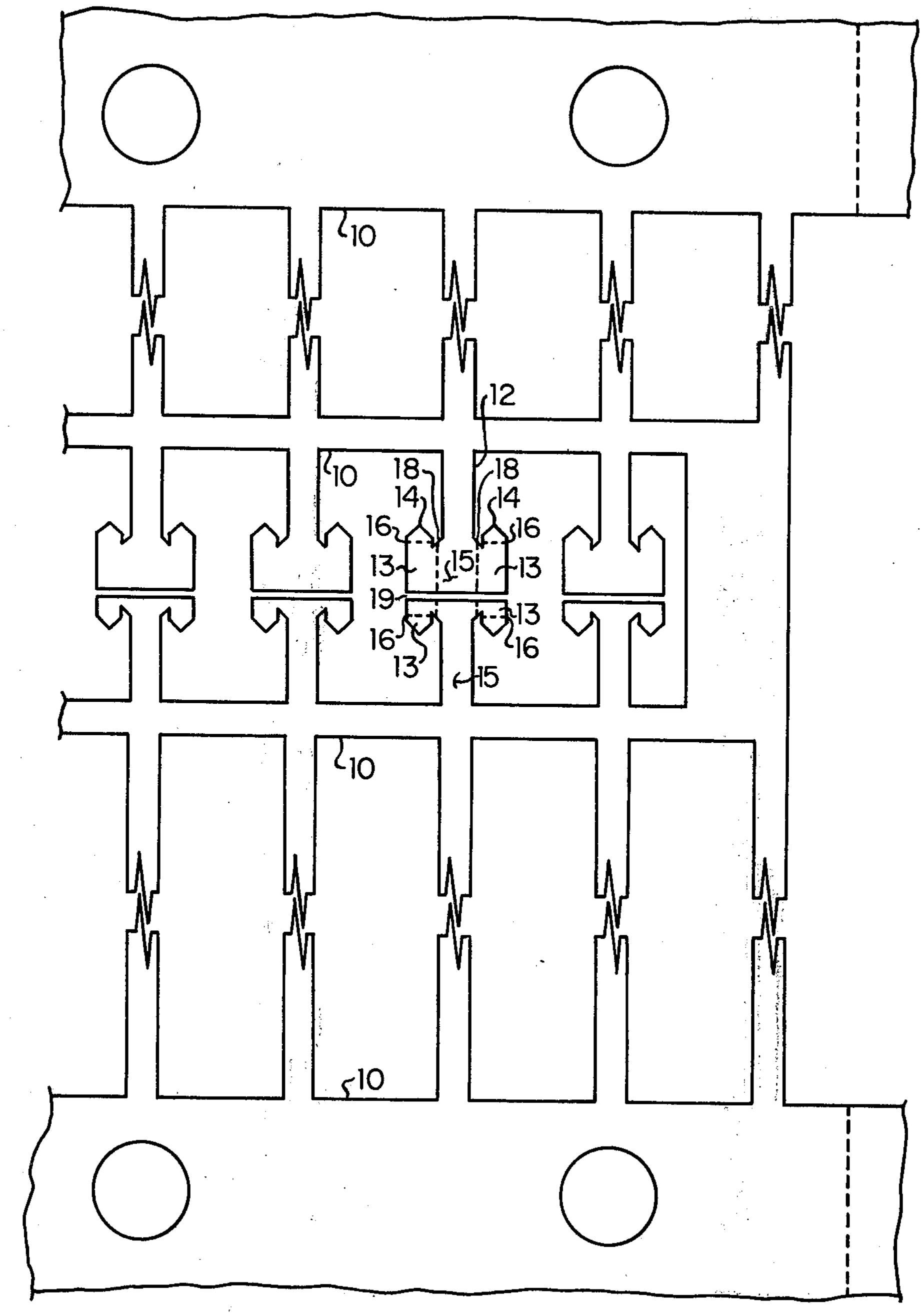
FIG. 1 is a top view of a lead frame according to the preferred embodiment of the present invention showing side-extensions of each pair prior to bending.

FIG. 1 shows lead frame 10 having a plurality of substantially identical, flat LED lead pairs including lead pair 12. Lead frame 10 is constructed of an electrically conductive material such as steel or alloys of iron and nickel or iron and copper. To enhance adhesion between the diode chip and the lead, flatness of the planar surface of the lead pair is held to approximately 0.002 inch. Lateral extensions 13 of the width dimension of lead pair 12 comprise the reflective sides of a reflector surrounding the mounting location of the light-emitting chip. To form the reflector projections 14 of lateral extensions 13 are bent along bend lines 16 to an angle of approximately 45° relative to planar mounting surface 15 of in-line lead pair 12. Lateral extensions 13 are then bent along bend lines 18 to an angle of approximately 45° relative to mounting surface 15 of in-line lead pair 12 to form reflector 20 as shown in FIGS. **2*a* and 2*b*. The angle of 45° is selected to reflect non-axially emitted light along an optical axis orthogonal to mounting surface 15**.

Figure 4:
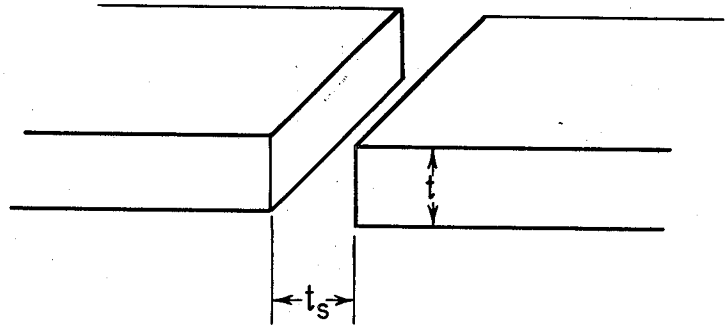
FIG. 4 is a perspective view showing the aspect ratio of the lead pair of FIG. 3.

Very small LED devices are often desired to reduce the distance between centers of adjacent devices in an array. For subminiature devices (on the order of 0.100 inch diameter), comparatively thin lead frame material must be used to provide the proper aspect ratio for manufacturing purposes. Referring to FIG. 4, the aspect ratio is defined as $t_s/t$, where $t_s$ is the width of the narrowest amount of material to be removed (for example separation 19 between anode and cathode leads), and t is the thickness of the material. The aspect ratio should be not less than one in order to reliably maintain manufacturing tolerances. Therefore, for devices each approximately 0.100 inches in diameter having a lead separation of 0.005 inches, the lead frame material should be approximately 0.005 inches thick. A lead separation of greater than 0.005 inches may allow some light to escape therethrough.

The lead pair, including at least lateral extensions 13 and the portions of in-line lead pair 12 contained within reflector 20 when formed, is coated with a reflective, electrically-conductive material such as gold or silver. The coating should be relatively thin, but sufficient to assure uniformity thereof.

Figure 2A:
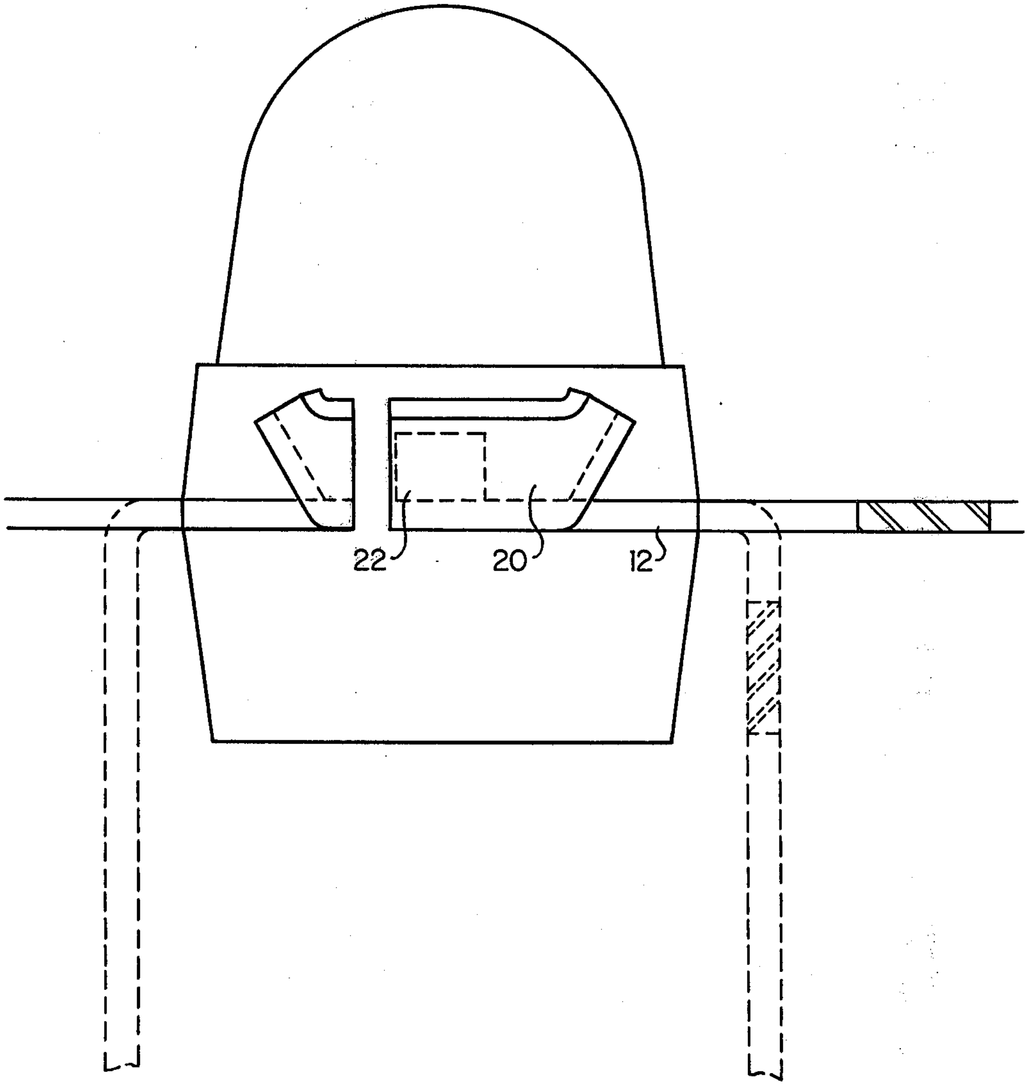
FIG. 2*a* is a top view of a lead pair with bent side extensions and mounted diode chips.
Figure 2B:
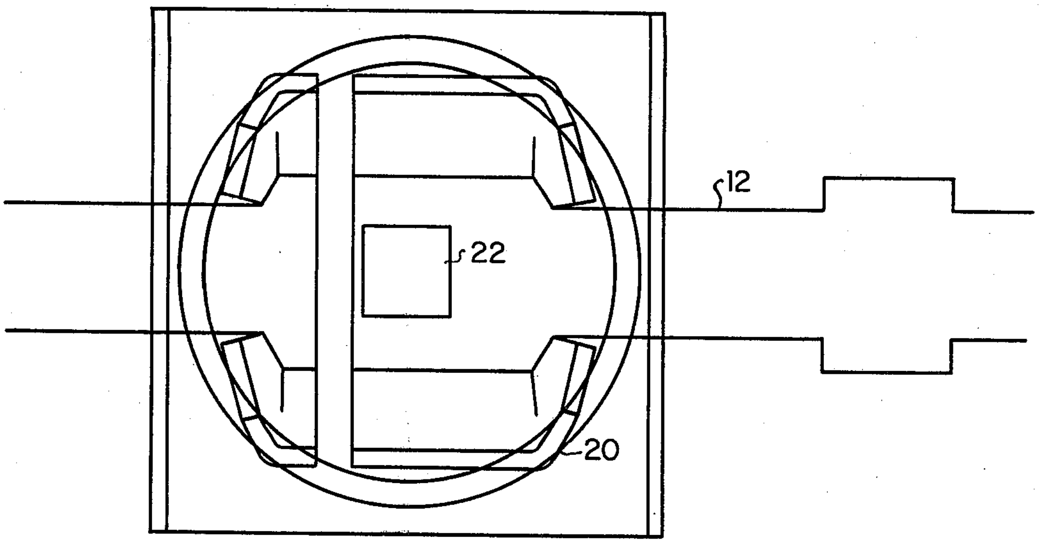
FIG. 2*b* is a top view of a lead pair of FIG. 2*a*.

FIG. 2 is a top view of cup 20 showing the location of diode chip 22 on one lead of in-line lead pair 12. FIG. **2*b* is a side view of cup 20 of FIG. 2*a*. After mounting the chip by conventional bonding techniques such as eutectic or conductive epoxy die attached, a wire which may be gold or aluminum is attached between chip 22 and the other lead of lead pair 12** to form the electrical circuit of the LED. Where other semiconductor chips are included more than one wire interconnection may be required.

Since the reflector is formed from lateral extensions of mounting surface 15 on both sides of separation 19 of lead pair 12, additional semiconductor devices including integrated circuit chips can be mounted on one lead with the LED chip or on the other lead of lead pair 12. Separation 19 of lead pair 12 could also evenly divide reflector 20 and mounting surface 15. This configuration, having a flat chip-mounting surface within a deep reflecting cup, also facilitates the manufacturing process by providing easy access for chip and wire bonding tools. In addition, the bent side portions block side emitted light that would partially illuminate adjacent LED's which would not otherwise be illuminated within an array of LED's.

Figure 3:
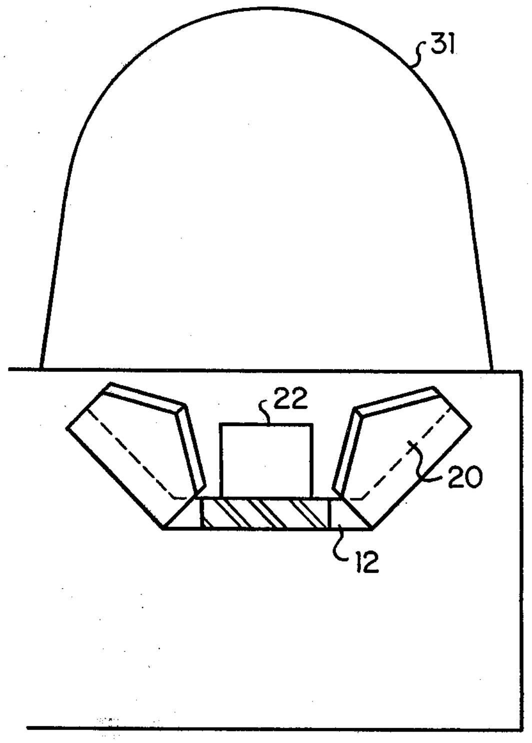
FIG. 3 is an end view of the lead pair of FIG. 2 after encapsulation.

When encapsulated as shown in FIG. 3, reflector 20 is centered under dome lens 31, the major diameter of which traces the outer periphery of reflector 20. In this way, nearly all reflected light collected and radiated by reflector 20 is directed through lens 31 coaxially therewith and orthogonally to mounting surface 15. A transparent material such as a two part epoxy resin or thermo-setting plastic to which dyes and light diffusers such as fine glass fragments or spheres can be added is used to encapsulate the devices. Various colored dyes are used to filter the spectrum of light emitted from the diode chip and to enhance on-off contrast of adjacent devices. Since light emitted coaxially with the optical axis of lens 31 is more intense than off-axis emissions, a light diffuser can be used to scatter such light to provide a more uniform emission of light from the device.

I claim:

1. An in-line lead pair for light-emitting diodes having improved luminous efficiency, said lead pair comprising:

first and second leads each having thickness and width dimensions, said thickness dimension being less than said width dimension, said first and second leads further having lateral extensions projecting therefrom, and said first lead being spaced apart from said second lead by a preselected distance; and said first lead having a mounting area in a plane determined by the width dimension and the longitudinal axis of the lead pair for mounting at least one light-emitting diode chip thereon;

said mounting area having a reflector formed by bending the lateral extensions of said first and second leads along a line essentially parallel to the longitudinal axis thereof and towards said mounting area to reflect non-axially emitted light from said diode chip along an axis orthogonal to said mounting area.

2. An in-line lead pair as in claim 1 wherein said lateral extensions are bent to an angle of approximately 45° relative to the plane defined by the mounting area, and said lateral extensions have projections which are bent to an angle of approximately 45° relative to the plane defined by said lateral extensions.

3. An in-line lead pair as in claim 1 wherein the first and second leads further have a reflective coating.

4. An in-line lead pair as in claim 1 wherein the preselected distance is approximately equal to the thickness dimension.

5. An in-line lead pair as in claim 1 wherein:

the first lead forms a greater portion of the reflector than the second lead.

6. An in-line lead pair as in claim 1 further including molded encapsulation wherein said encapsulation is formed into a lens having an outer diameter which is approximately equal to the major dimension of the reflector to direct the emitted light orthogonal to the plane defined by the mounting area.

7. An in-line pair as in claim 6 wherein the encapsulation includes light diffusers.

* * * * *